(12) United States Patent
Yamamoto

(10) Patent No.: US 8,280,074 B2
(45) Date of Patent: Oct. 2, 2012

(54) AUDIO SIGNAL PROCESSING APPARATUS

(75) Inventor: Yasunori Yamamoto, Gunma-ken (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1068 days.

(21) Appl. No.: 12/187,576

(22) Filed: Aug. 7, 2008

(65) Prior Publication Data

US 2009/0041264 A1 Feb. 12, 2009

(30) Foreign Application Priority Data

Aug. 7, 2007 (JP) ................................. 2007-205535

(51) Int. Cl.
*H04B 15/00* (2006.01)
(52) U.S. Cl. ........................................ 381/94.5; 330/10
(58) Field of Classification Search ................. 381/94.1, 381/94.5, 97
See application file for complete search history.

(56) References Cited

U.S. PATENT DOCUMENTS

| 2002/0009000 A1* | 1/2002 | Goldberg et al. ............. 365/200 |
| 2003/0038674 A1* | 2/2003 | Masuda et al. ................. 330/10 |
| 2004/0046680 A1* | 3/2004 | Masuda et al. ................ 341/143 |
| 2004/0217808 A1 | 11/2004 | Kim et al. |
| 2005/0083116 A1* | 4/2005 | Risbo et al. ..................... 330/10 |
| 2007/0188220 A1 | 8/2007 | Masuda et al. |

FOREIGN PATENT DOCUMENTS

| JP | 7-297646 A | 11/1995 |
| JP | 2004-56253 A | 2/2004 |
| JP | 2004336765 A | 11/2004 |
| JP | 2004-363928 A | 12/2004 |
| JP | 2007-181148 A | 7/2007 |

OTHER PUBLICATIONS

Japanese Office Action for Patent Application No. 2007-205535 mailed Jul. 19, 2011 with English translation.
Notice of Grounds for Rejection for Patent Application Serial No. 2007-205535, mailed May 29, 2012, with English translation.

* cited by examiner

*Primary Examiner* — Marcos D. Pizarro
*Assistant Examiner* — Suian Tang
(74) *Attorney, Agent, or Firm* — Cantor Colburn LLP

(57) ABSTRACT

An audio signal processing apparatus for outputting an input digital audio signal as a positive phase PWM signal and a negative phase PWM signal. The resolution of the input digital audio signal is converted to a low resolution and noise shaping is performed to generate a positive phase digital signal (REF_P) and a negative phase digital signal (REF_N). Both signal patterns are compared at a buffer and pattern comparator section when muting. If the signal patterns match, a selector outputs a set value having 50% duty instead of the digital signals to optimize timing for switching to 50% duty when muting.

4 Claims, 6 Drawing Sheets

AUDIO SIGNAL PROCESSING APPARATUS

BACKGROUND OF THE INVENTION

1. Field of the Invention

The present invention relates to an audio signal processing apparatus, and more particularly to processing when muting.

2. Description of the Related Art

A class D amplifier for amplifying audio signals uses a pulse width modulation (PWM) method for input digital PCM signals. In a BTL (Bridged Transformer-Less, Bridged Tied-Load, or Balanced Transformer-Less) connected amplifier, a positive phase PWM signal is output to one channel and a negative phase PWM signal, not GND, is output to another channel to drive a speaker directly or via a demodulation filter.

When performing a mute operation in this class D amplifier, the positive phase PWM signal and the negative phase PWM signal approach the PWM width when muting. However, when re-sampling to convert a quantization bit rate to a lower bit rate and performing noise shaping to shift the distribution of quantization noise to an inaudible range so as to simplify the PWM conversion operation and speed up processing, an amplitude of the PWM output remains when muting and audible noise is generated. Thus, a technique has been proposed for removing the audible noise caused by the noise shaping operation by switching both the positive phase PWM signal and the negative phase PWM signal to 50% duty signals when muting.

FIG. 6 shows a positive phase PWM signal output waveform 100 and a negative phase PWM signal output waveform 200. The PWM output waveforms shown are after demodulation. Furthermore, FIG. 7 shows the signal waveforms 100 and 200 when muting. In the figures, the abscissa represents the time axis and the ordinate represents the amount of deviation from 50% duty of the respective PWM pulse signals. Since the noise shaping effect differs in the positive phase side and in the negative phase side (noise shaper output is determined from input value of past infinite time due to a feedback construction so that the positive phase side and the negative phase side normally have waveforms having completely no correlation), the amount of deviation of the respective signal also varies.

Therefore, when noise removal is attempted by switching the positive phase side and negative phase side signals to 50% duty at an arbitrary timing after muting starts, the duty varies discretely at the switching timing as shown in FIG. 8 and unintended noise (namely, pop noise), which is not shown, results in being generated. Depending on the applied field this noise cannot be ignored.

In Japanese Patent Laid-Open Publication No. 2004-336765, when a mute signal is received in a processing circuit, which outputs to an amplifier a pulse width modulated second signal and a pulse width modulated first signal, which has the same phase or opposite phase with the second signal, a mute circuit outputs a selection signal for outputting a reduced pulse width first signal or a reduced pulse width second signal.

When the PWM resolution is high, noise itself is small so that switching to 50% duty is not necessary and noise is not generated. However, when the PWM resolution is lowered in consideration of cost reduction and mass production, the above-mentioned problem accompanying the noise shaping process becomes significant and annoys the user when muting.

SUMMARY OF THE INVENTION

The present invention provides an apparatus for suppressing noise generation when muting.

The present invention is an audio signal processing circuit, connected in a BTL configuration directly or via a demodulation filter to a speaker, for outputting an input audio signal as a positive phase PMW signal and a negative phase PWM signal, with the audio signal processing circuit including a switching circuit for switching the positive phase PWM signal and the negative phase PWM signal respectively to 50% duty signals when muting, and a control circuit for controlling the switching timing to the 50% duty signals, wherein the control circuit performs switching when the positive phase PWM signal and the negative phase PWM signal have identical patterns.

According to one embodiment of the present invention, the control circuit judges patterns to be identical when the positive phase PWM signal and the negative phase PWM signal have identical levels within a predetermined allowable range and are at 50% duty.

Furthermore, the present invention is an audio signal processing circuit, connected in a BTL configuration directly or via a demodulation filter to a speaker, for outputting an input audio signal as a positive phase PWM signal and a negative phase PWM signal, with the audio signal processing circuit including a quantizer for quantizing an input digital audio signal into a low-resolution digital audio signal, a noise shaper for shifting quantization noise distribution of the low-resolution digital audio signal to a high frequency, a pattern comparator circuit for comparing patterns of a positive phase digital signal and a negative phase digital signal from the noise shaper when muting, a selector for outputting the positive phase digital signal and the negative phase digital signal when patterns are judged not to match at the pattern comparator circuit when muting and outputting a predetermined set value instead of the positive phase digital signal and the negative phase digital signal when patterns are judged to match, and a PWM modulator for PWM modulating and outputting the positive phase digital signal, the negative phase digital signal, and the set value output from the selector, wherein the set value is a value having 50% duty when PWM modulated at the PWM modulator.

According to one embodiment of the present invention, the pattern comparator circuit compares a plurality of sampling data of the positive phase digital signal and of the negative phase digital signal and judges that patterns match when the duty is 50% when pulse width modulated and levels are identical within a predetermined allowable range.

According to the present invention, after converting to a low-resolution digital audio signal and further performing noise shaping, even if noise is generated due to the positive phase and negative phase PWM signals when muting, at a timing when patterns of both signals match or more specifically when in the neighborhood of 50% duty, namely, at a timing when the output voltage is in the neighborhood of zero, switching to 50% duty signals is performed so that the transition to 50% duty signals is continuously performed and the noise generation accompanying switching can be effectively suppressed.

DETAILED DESCRIPTION OF THE PREFERRED EMBODIMENTS

Figure 1:
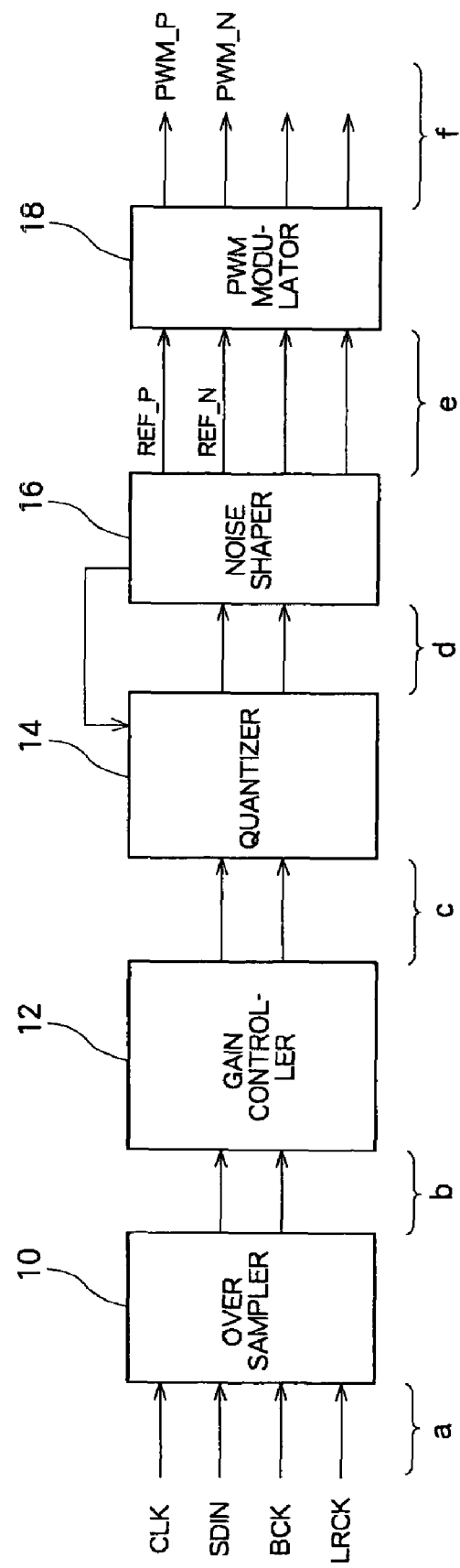
FIG. 1 shows an overall block diagram of an embodiment.
Figure 2A:
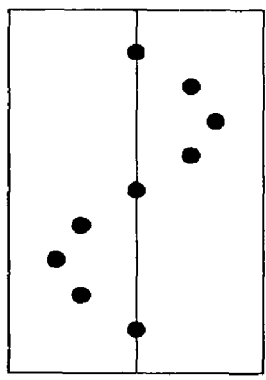
FIGS. 2A, 2B, 2C, 2D, 2E, and 2F illustrate signal waveforms at the respective blocks of FIG. 1.
Figure 2B:
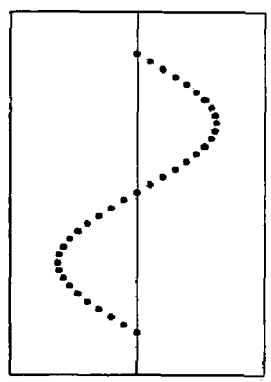

FIG. 1 shows an overall block diagram of an audio signal processing apparatus. Furthermore, FIG. 2A to FIG. 2F respectively show signal waveforms of the sections "a" to "f" in FIG. 1. An audio signal, such as from a DSP, together with various clock signals are supplied to an over-sampler 10. The audio signal supplied to the over-sampler 10 is a PCM signal, for example, a 24-bit signal having a sampling frequency fs=32 to 192 kHz. FIG. 2A shows a waveform of the input audio signal. The over-sampler 10 performs sampling at a frequency higher than the sampling frequency of the input audio signal, for example, fs=384 kHz, and outputs the over-sampled audio signal. FIG. 2B shows a waveform of the output signal from the over-sampler 10.

Figure 2C:
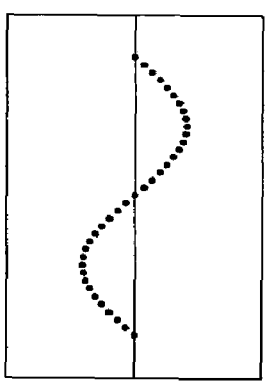

A gain controller 12 adjusts and outputs the gain of the over-sampled input audio signal. FIG. 2C shows a waveform of the output signal from the gain controller 12.

Figure 2D:
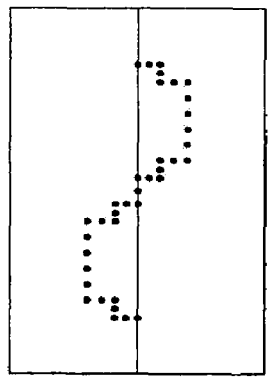

A quantizer 14 re-quantizes and outputs the gain-adjusted input audio signal at a different resolution, namely, at a lower resolution (such as 4 bits). FIG. 2D shows a waveform of the output signal from the quantizer 14. A resolution lower than that of FIG. 2C is shown.

Figure 2E:
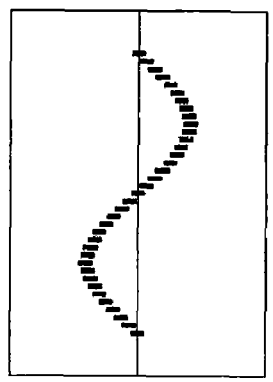

A noise shaper 16 shifts and outputs the distribution of quantization noise generated by the aforementioned conversion to low resolution to an inaudible frequency range. FIG. 2E shows a waveform of an output signal from the noise shaper 16.

Figure 2F:
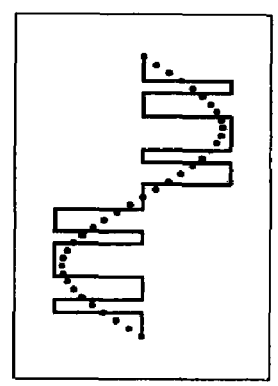

A PWM modulator 18 PWM modulates and outputs the input audio signals from the noise shaper 18. The PWM modulator 18 basically PWM modulates two signals from the noise shaper 16, namely, a positive phase input audio signal REF_P and a negative phase input audio signal REF_N, respectively using a single-sided triangle wave or a double-sided triangle wave, or switches to 50% duty signals at a predetermined timing, then outputs the signals. FIG. 2F shows a waveform of the PWM modulated signal (differential output).

Figure 3:
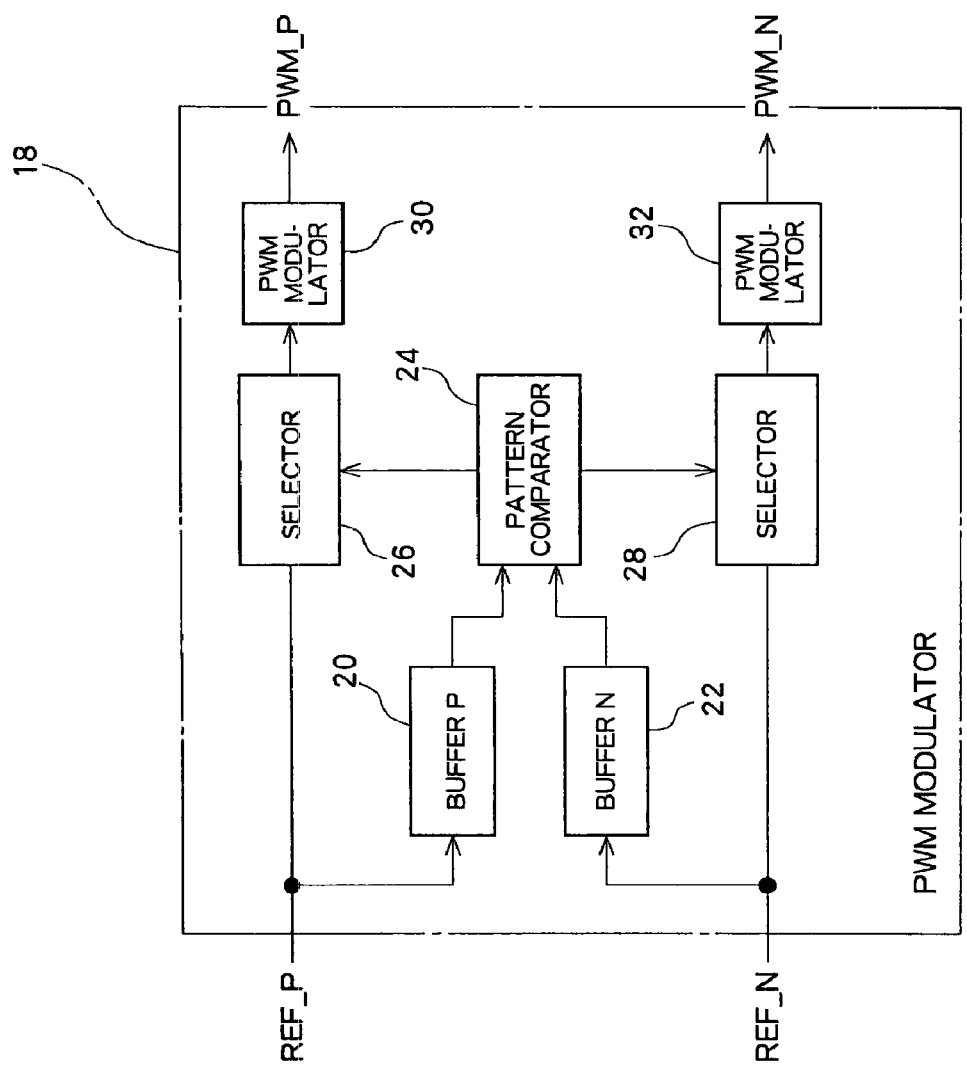
FIG. 3 is a block diagram of a PWM modulator of the embodiment.

FIG. 3 shows a block diagram of the PWM modulator 18 of FIG. 1. The PWM modulator 18 includes a positive phase buffer (buffer P) 20, a negative phase buffer (buffer N) 22, a pattern comparator 24, a positive phase selector 26, a negative phase selector 28, a positive phase PWM modulator 30, and a negative phase selector 32.

The buffer 20 holds the positive phase input audio signal only for a fixed period. The buffer 22 holds the negative phase input audio signal only for the identical fixed period. The positive phase and negative input audio signals held for only the fixed period are supplied to the pattern comparator 24.

The pattern comparator 24 compares the positive phase input audio signal and the negative phase input audio signal of the fixed period and judges whether or not they match. Specifically, the two input audio signals of the fixed period are judged to match if they have identical values (zero differential output) and the PWM duties of the input audio signals have values (or resultant set values) corresponding to a neighborhood of 50%. More specifically, the signals are judged to match if the differential value and the deviation from 50% duty of the two signals are less than a small predetermined value. The small value functions as an allowable value for judging whether or not the signals match. When the pattern judgment section 24 judges that the signals match, pattern matching signals are output to the selectors 26 and 28.

If the patterns do not match, namely, if the pattern matching signals are not supplied, the selectors 26 and 28 output the input audio signals directly to the PWM modulators 30 and 32. If the patterns match, namely, if the pattern matching signals are supplied, set values resulting in 50% duty signals are output instead of the input audio signals.

The positive phase PWM modulator 30 and the negative phase modulator 32 PWM modulates and outputs the input audio signal or the 50% duty set value. Since the input audio signals are PWM modulated when the patterns of the positive phase and negative phase input audio signals do not match and the 50% duty set values are PWM modulated when the patterns match, the PWM output switches to 50% duty at the timing when the patterns match.

Figure 4:
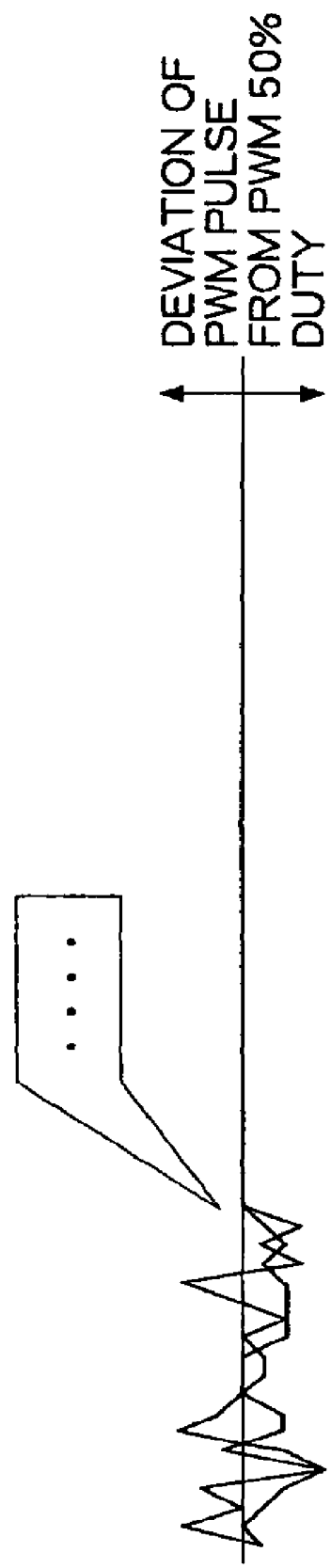
FIG. 4 illustrates the switching timing of the embodiment.

Therefore, as shown in FIG. 4, noise is not generated when the positive phase and negative phase signals are switched to 50% duty at an appropriate timing after muting starts and the noise accompanying the noise shaping process can be removed.

Figure 5:
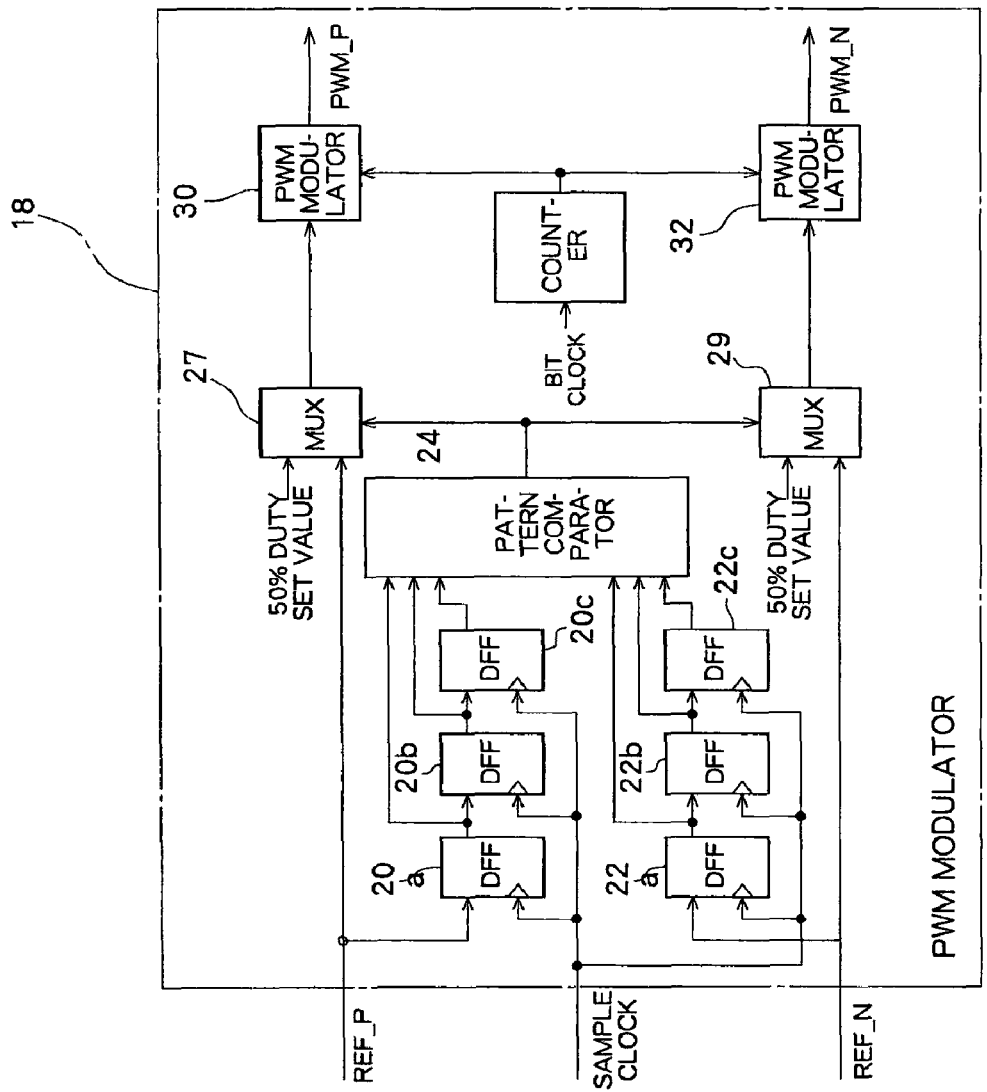
FIG. 5 is a more detailed block diagram of the PWM modulator of the embodiment.
Figure 6:
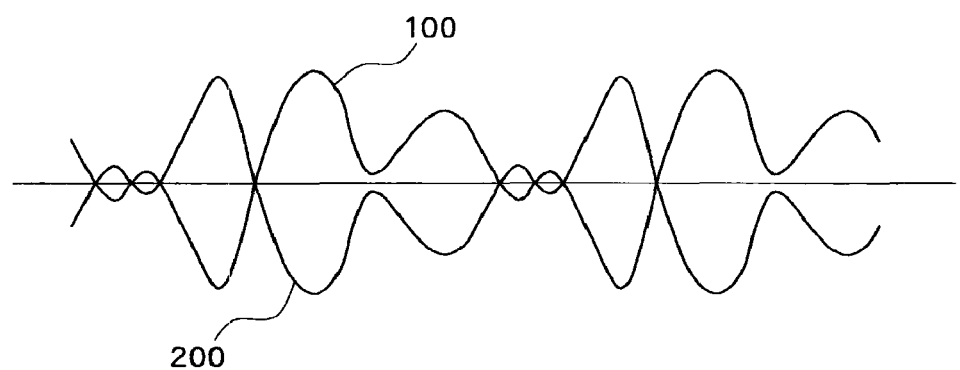
FIG. 6 illustrates positive phase and negative phase signal waveforms.
Figure 7:
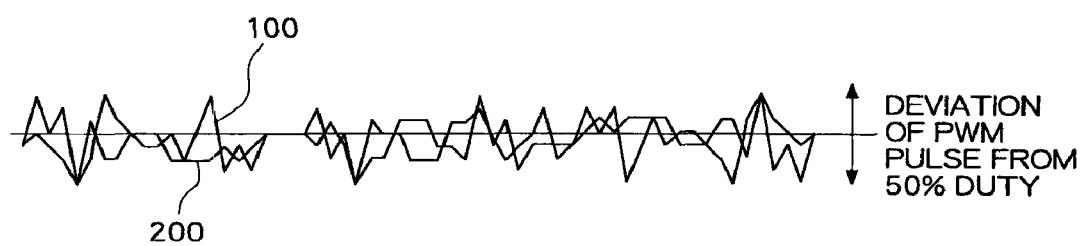
FIG. 7 illustrates the amount of deviation from 50% duty of positive phase and negative phase signals when muting.
Figure 8:
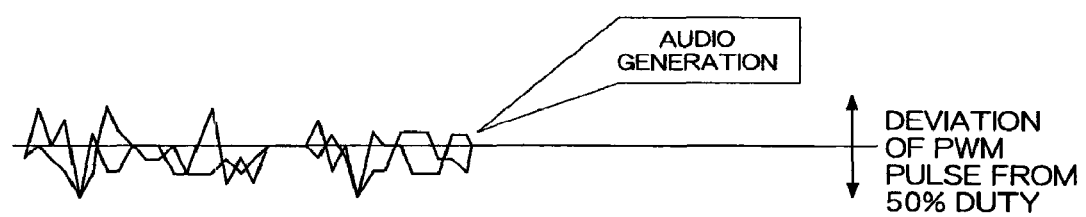
FIG. 8 illustrates switching timing for the related art.

FIG. 5 shows a detailed block diagram of the PWM modulator 18 shown in FIG. 3. The positive phase buffer (buffer P) 20 is formed from three delay devices (D-type flip-flops: DFF) 20a, 20b, and 20c in a cascade connection and the negative phase buffer (buffer N) 22 is also formed from three delay devices (D-type flip flops: DFF) 22a, 22b, and 22c in a cascade connection. The delay device 20a is supplied with a positive phase input signal as well as a sample clock and the delay device 20a outputs the input audio signal with a delay of one sample clock to the pattern comparator 24 and to the delay device 20b of the next stage. The delay device 20b is supplied with the input audio signal, which has been delayed by one sample clock, and the sample clock, and the delay device 20b further delays the input audio signal by one more sample clock, thereby supplying the input audio signal with a total delay of two sample clocks to the pattern comparator 24 and to the delay device 20c of the next stage. The delay device 20c further delays the input audio signal by one more sample clock, thereby supplying the input audio signal with a total delay of three sample clocks to the pattern comparator 24. Therefore, the pattern comparator 24 is supplied with a total of three sample data types: the positive phase input audio signal delayed by one sample clock, the positive phase input audio signal delayed by two sample clocks, and the positive phase input audio signal delayed by three sample clocks. Similarly, the delay devices 22a, 22b, and 22c forming the negative phase buffer 22 supply to the pattern comparator 24 a total of three sample data types: the negative phase input audio signal delayed by one sample clock, the negative phase input audio signal delayed by two sample clocks, and the negative phase input audio signal delayed by three sample clocks.

The pattern comparator 24 compares the three sample data types of the positive phase and the three sample data types of the negative phase and judges whether or not the respective values match (within an allowable range) and the value matches (matches within an allowable range) a value corresponding to 50% PWM duty (namely, the value to be converted to 50% duty at the PWM modulator of a subsequent stage). When both conditions are satisfied, a pattern match signal is supplied to multiplexers (MUX) 27 and 29.

The positive phase multiplexer 27 and the negative phase multiplexer 29 respectively function as the selectors 26 and 28 of FIG. 3 and supply the input audio signal to the PWM modulators 30 and 32 for PWM modulation when the pattern match signal is not supplied from the pattern comparator 24. Therefore, in this case, since the input audio signal is directly PWM modulated and the signal converted to low resolution and noise shaped is PWM modulated, there is a possibility of noise generation when muting. On the other hand, when the multiplexers 27 and 29 are supplied with the pattern match signal from the pattern comparator 24, 50% duty set values are supplied to the PWM modulators 30 and 32 instead of the input audio signal. Therefore, since the positive phase and the negative phase both become 50% duty signals at this timing, noise is removed. Moreover, the timing of the switching is when the patterns match and the duty also varies continuously before and after switching so that the generation of pop noise can also be suppressed.

Although the three-stage cascade-connected delay devices 20a to 20c and 22a to 22c are used for both the positive phase and the negative phase in the embodiment, four stages or more may be used as necessary. When converting to low resolution digital signals at the quantizer 14, setting the resolution of the quantizer 14 relatively high can reduce the number of cascaded stages of delay devices. However, at least a three-stage cascade connection is preferable. It should be noted that if the number of cascaded stages is high, the patterns of the positive phase digital signal and the negative phase digital signal will not match and the timing for switching to the 50% duty signal will be delayed for only that amount. Thus, it is preferable to set the number of cascaded stages to a reasonable number (three stages to five stages). Similarly, also for the allowable range for judging whether or not the patterns of the positive phase digital signal and the negative phase digital signal match, it is sufficient to regard patterns in a range as matching, such as approximately ±2% to ±5%, rather than requiring the duty of both the positive phase digital signal and the negative phase digital signal to strictly match 50%.

What is claimed is:

1. An audio signal processing circuit, connected in a BTL configuration directly or via a demodulation filter to a speaker, for outputting an input audio signal as a positive phase PWM signal and a negative phase PWM signal, said audio signal processing circuit comprising:

a quantizer for quantizing an input digital audio signal into a low-resolution digital audio signal;

a noise shaper for shifting quantization noise distribution of the low-resolution digital audio signal to a high frequency;

a pattern comparator circuit for comparing patterns of a positive phase digital signal and a negative phase digital signal from the noise shaper when muting;

a selector for outputting said positive phase digital signal and negative phase digital signal when patterns are judged not to match at said pattern comparator circuit and outputting a predetermined set value instead of said positive phase digital signal and said negative phase digital signal when patterns are judged to match; and a PWM modulator for PWM modulating and outputting said positive phase digital signal, said negative phase digital signal, and said set value output from said selector, wherein said set value is a value having 50% duty when PWM modulated at said PWM modulator.

2. An apparatus according to claim 1, wherein:

said pattern comparator circuit compares a plurality of sample data of said positive phase digital signal and of said negative phase digital signal and judges patterns match when levels are identical within a predetermined allowable range.

3. An apparatus according to claim 2, wherein:

said pattern comparator circuit compares a plurality of sampling data of said positive phase digital signal and of said negative phase digital signal and judges patterns match when the duty is 50% when PWM modulated within a predetermined allowable range.

4. An apparatus according to claim 1, wherein:

said pattern comparator circuit comprises a delay circuit for sequentially delaying said positive phase digital signal and said negative phase digital signal, respectively, only by n sampling clocks (where n is a natural number) and compares N sampling data (where N is a natural number of 2 or higher) respectively obtained after being delayed.

* * * * *